US010810397B2

(12) United States Patent
Zeng et al.

(10) Patent No.: US 10,810,397 B2
(45) Date of Patent: Oct. 20, 2020

(54) DISPLAY PANEL AND DISPLAY DEVICE

(71) Applicant: Shanghai Tianma Micro-Electronics Co., Ltd., Shanghai (CN)

(72) Inventors: Yang Zeng, Shanghai (CN); Lihua Wang, Shanghai (CN); Haochi Yu, Shanghai (CN); Qing Zhang, Shanghai (CN); Lingxiao Du, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 90 days.

(21) Appl. No.: 16/130,723

(22) Filed: Sep. 13, 2018

(65) Prior Publication Data
US 2019/0294848 A1 Sep. 26, 2019

(30) Foreign Application Priority Data
Mar. 26, 2018 (CN) .......................... 2018 1 0251304

(51) Int. Cl.
*G06K 9/00* (2006.01)
*G06F 3/041* (2006.01)
*H01L 27/32* (2006.01)

(52) U.S. Cl.
CPC ......... *G06K 9/0004* (2013.01); *G06F 3/0412* (2013.01); *G06K 9/00053* (2013.01); *H01L 27/3276* (2013.01); *G06K 2009/0006* (2013.01)

(58) Field of Classification Search
CPC ............. G06K 9/0004; G06K 9/00053; G06K 2009/0006; G06F 3/0412; H01L 27/3276
See application file for complete search history.

(56) References Cited

U.S. PATENT DOCUMENTS

| 2003/0174870 A1* | 9/2003 | Kim | G02F 1/13338 382/124 |
| 2007/0074914 A1* | 4/2007 | Geaghan | G06F 3/044 178/18.06 |
| 2016/0092717 A1* | 3/2016 | Ling | G06K 9/0004 382/125 |

FOREIGN PATENT DOCUMENTS

| CN | 103440822 A | 12/2013 |
| CN | 103972271 A | 8/2014 |

(Continued)

OTHER PUBLICATIONS

Chinese Office Action for Chinese Priority Application No. 201810251304,3; Office Action dated Sep. 26, 2019.

(Continued)

*Primary Examiner* — Wing H Chow
(74) *Attorney, Agent, or Firm* — Miller, Matthias & Hull LLP

(57) ABSTRACT

Provided are a display panel and a display device. The display panel includes a display assembly, the display assembly includes an array substrate and a plurality of pixel units disposed on the array substrate; a fingerprint recognition assembly disposed on one side of the array substrate facing away from the plurality of pixel units, the fingerprint recognition assembly includes a first substrate and at least one fingerprint recognition unit disposed on the first substrate; and the array substrate includes a plurality of transparent regions and a plurality of non-transparent regions, the array substrate further includes a plurality of metal wires, a ratio of a line width of a portion of at least one of the metal wires disposed in at least one respective transparent region to a line width of a portion of the at least of the metal wires disposed in a respective non-transparent region is less than 1.

15 Claims, 12 Drawing Sheets

(56) References Cited

FOREIGN PATENT DOCUMENTS

| | | |
|---|---|---|
| CN | 106981499 A | 7/2017 |
| CN | 107092892 A | 8/2017 |

OTHER PUBLICATIONS

Office Action for related Chinese Application No. 201810251304.3; report dated Jun. 1, 2020.

\* cited by examiner

DISPLAY PANEL AND DISPLAY DEVICE

CROSS-REFERENCE TO RELATED APPLICATIONS

This application claims priority to a Chinese patent application No. 201810251304.3 filed on Mar. 26, 2018, the disclosure of which is incorporated herein by reference in its entirety.

TECHNICAL FIELD

The present disclosure relates to display technologies, and in particular relates to a display panel and a display device.

BACKGROUND

Fingerprints are inherent for every person. With the development of technology, there are many display devices with a function of fingerprint recognition appearing in the market, such as mobile phones, tablet computers, and smart wearable devices. Before operating the display device with the function of fingerprint recognition, a user only needs to touch the display device by using a finger to perform an authority verification, which simplifies an authority verification process.

A display panel with a function of fingerprint recognition commonly provides a fingerprint recognition assembly to be disposed under a display assembly, and light emitted from a light source is reflected by the touch object and passes through the display assembly, and is received by the fingerprint recognition assembly under the display assembly. Therefore, the function of fingerprint recognition is achieved by the display panel. However, opaque film layers, such as metal layers, in the display assembly occupy most of projection areas of the display assembly, so that the light transmittance of the display assembly is relatively low, and the light irradiated to the fingerprint recognition assembly is reduced. Therefore, the strength of fingerprint recognition signals is relatively small.

SUMMARY

The present disclosure provides a display panel and a display device, by providing a ratio of a line width of a portion of at least one metal wire disposed in at least one respective transparent region to a line width of a portion of the at least one metal wire disposed in a respective non-transparent region is less than 1, in contrast with a related art, the line width of a portion of the at least one metal wires disposed in the at least one corresponding transparent region is reduced, and the strength of fingerprint recognition signals is improved.

In a first aspect, the present disclosure provides a display panel, and the display panel includes: a display assembly, the display assembly includes an array substrate and a plurality of pixel units disposed on the array substrate; a fingerprint recognition assembly, the fingerprint recognition assembly is disposed on one side of the array substrate facing away from the plurality of pixel units, the fingerprint recognition assembly includes a first substrate and at least one fingerprint recognition unit disposed on the first substrate, and the at least one fingerprint recognition unit is configured to perform a fingerprint recognition based on light reflected from a touch object to the fingerprint recognition unit; and the array substrate includes a plurality of transparent regions and a plurality of non-transparent regions, the array substrate further includes a plurality of metal wires, a ratio of a line width of a portion of the metal wires disposed in at least one respective transparent region to a line width of a portion of the metal wires disposed in a respective non-transparent region is less than 1.

In a second aspect, the present disclosure further provides a display device, and the display device includes the display panel described in the first aspect.

The present disclosure provides a display panel and a display device, where the fingerprint recognition unit is disposed on one side of the array substrate facing away from the pixel units, the fingerprint recognition unit is configured to perform a fingerprint recognition based on light reflected to the fingerprint recognition unit via a touch object, that is, the light reflected to the fingerprint recognition unit should pass through the array substrate. By providing a ratio of a line width of a portion of at least one metal wires disposed in at least one respective transparent region to a line width of a portion of the at least one metal wires disposed in a respective non-transparent region is less than 1, that is, by providing a line width of a portion of at least one metal wires disposed in at least one respective transparent region being less than a line width of a portion of the at least one metal wires disposed in a respective non-transparent region, in contrast with a related art, the line width of a portion of the at least one metal wires disposed in a respective transparent region is reduced, an obscuration by a portion of the metal wires disposed in the respective transparent region to the light reflected to the fingerprint recognition assembly is decreased, thereby improving the light transmittance of the fingerprint recognition assembly and increasing the strength of fingerprint recognition signals.

BRIEF DESCRIPTION OF DRAWINGS

By referring to a detailed description of non-restrictive embodiments according to below drawings, other features, purposes and advantages of the present disclosure become more apparent.

DETAILED DESCRIPTION

Figure 1:
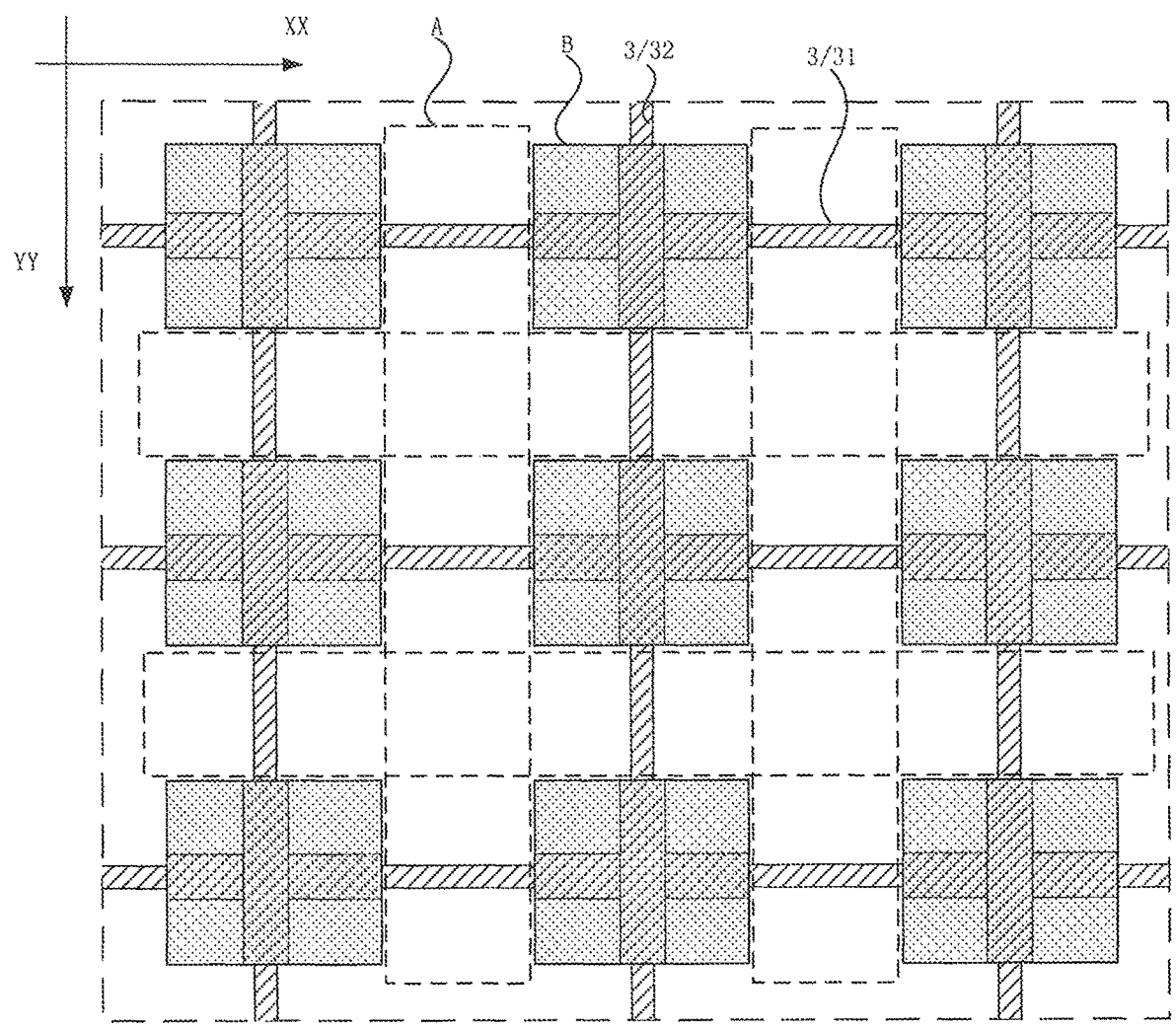
FIG. 1 is a top view of a display panel according to an embodiment of the present disclosure.

The present disclosure is further described below in combination with the drawings and embodiments. It should be understood that the specific embodiments described herein are merely used to explain the present disclosure rather than limiting the present disclosure. In addition, it should be stated that in order to facilitate the description, merely a part of structures related to the present disclosure rather than the whole structure are illustrated in the drawings. Throughout the description, the same or similar numerals denote the same or similar structures, elements and processes. It should also be noted that, embodiments and features of the embodiments may be combined under no conflicts.

The present disclosure provides a display panel, the display panel includes a display assembly and a fingerprint recognition assembly. The display assembly includes an array substrate and a plurality of pixel units disposed on the array substrate. The fingerprint recognition assembly disposed on one side of the array substrate facing away from the plurality of pixel units, the fingerprint recognition assembly includes a first substrate and at least one fingerprint recognition unit disposed on the first substrate. The fingerprint recognition unit is configured to perform a fingerprint recognition based on light reflected to the fingerprint recognition unit via a touch object. The array substrate includes a plurality of transparent regions and a plurality of non-transparent regions, and the array substrate further includes a plurality of metal wires. A ratio of a line width of a portion of at least one of the plurality of metal wires disposed in at least one respective transparent region to a line width of a portion of the at least one of the plurality of metal wires disposed in a respective non-transparent region is less than 1.

Persons' dermatoglyphs including a fingerprint are different in pattern, breakpoints and intersection points, showing uniqueness and remaining unchanged throughout one's life. In view of the above contents, we can identify a person with his fingerprint to verify his real identity by comparing his fingerprint with pre-stored fingerprint data, and that is fingerprint recognition technology. With the development of electronic integrated manufacturing technology, an optical fingerprint recognition technology in the fingerprint recognition technology has begun to enter in our daily life and has become a technology which is researched in-depth, most widely applied and developed to a maturity stage, in a biological detection. The working principle of the optical fingerprint recognition technology is, light emitted from a light source of the display panel irradiates to a finger, reflection light formed by the light reflecting via the finger is transmitted to a fingerprint recognition sensor, and the fingerprint recognition sensor is configured to collect light signals entering into the fingerprint recognition sensor. Due to an existence of a specific pattern on the fingerprint, the strengths of reflection light formed at ridges and valleys are different. As a result, the light signals collected by each fingerprint recognition sensor are different, and thus a function of the fingerprint recognition is achieved. Therefore, a real identification of a user may be determined based on the above.

A display panel with a function of fingerprint recognition commonly provides a fingerprint recognition assembly disposed under a display assembly, and light emitted from a light source is reflected by the touch object and passes through the display assembly, and is received by the fingerprint recognition assembly under the display assembly. Therefore, the function of fingerprint recognition is achieved by the display panel. However, opaque film layers, such as metal layers, in the display assembly occupy most of projection areas of the display assembly, so that the light transmittance of the display assembly is relatively low, and the light irradiated to the fingerprint recognition assembly is reduced. Therefore, the strength of fingerprint recognition signals is relatively small.

The present disclosure provides the fingerprint recognition unit disposed on one side of the array substrate facing away from the pixel units, and the fingerprint recognition unit is configured to perform a fingerprint recognition based on light reflected to the fingerprint recognition unit via a touch object, that is, the light reflected to the fingerprint recognition unit should pass through the array substrate. By providing a ratio of a line width of a portion of at least one metal wire disposed in at least one respective transparent region to a line width of a portion of the at least one metal wire disposed in a respective non-transparent region being less than 1, that is, by providing a line width of a portion of at least one metal wire disposed in at least one respective transparent region being less than a line width of a portion of the at least one metal wire disposed in a respective non-transparent region, in contrast with a prior art, the line width of a portion of the at least one metal wire disposed in a corresponding transparent region is reduced, and obscuration by a portion of the metal wires disposed in the respective transparent region to the light reflected to the fingerprint recognition assembly is decreased, thereby improving the light transmittance of the fingerprint recognition assembly and increasing the strength of fingerprint recognition signals.

The above contents are principles of the present disclosure, a detailed description on the technical solutions of the present disclosure is clearly and fully given in combination with the drawings of the present disclosure. Based on the embodiments of the present disclosure, other embodiments obtained by those skilled in the art without creative works fall into a protection scope of the present disclosure.

Figure 2:
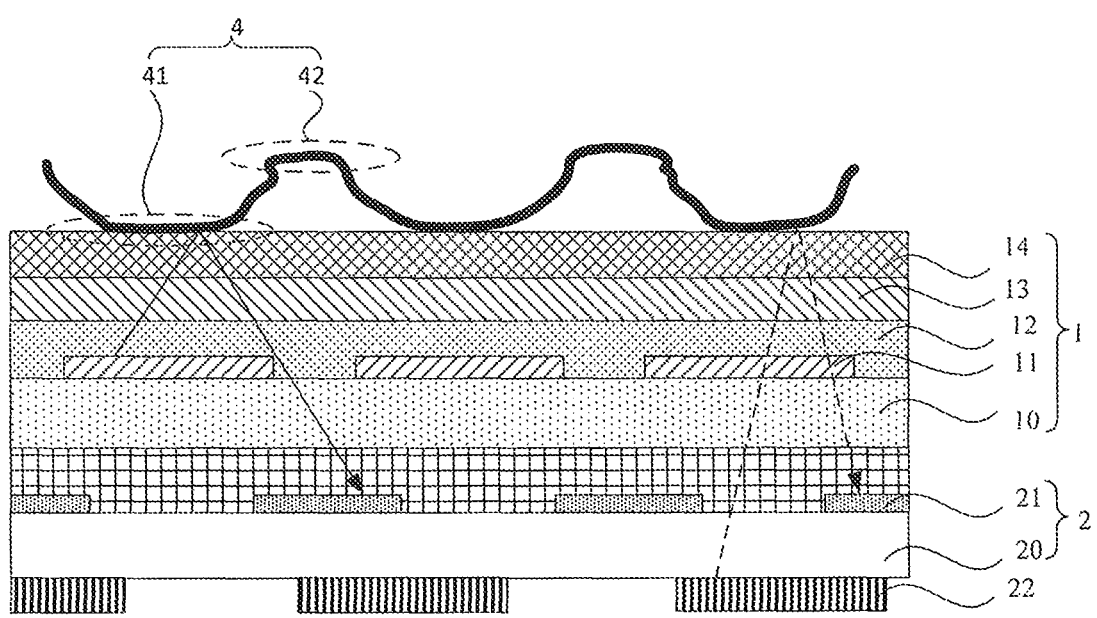
FIG. 2 is a cross-section view of a display panel according to an embodiment of the present disclosure.

FIG. 1 is a top view of a display panel according to an embodiment of the present disclosure, and FIG. 2 is a cross-section view of a display panel according to an embodiment of the present disclosure. In combination with FIG. 1 and FIG. 2, the display panel includes a display assembly 1 and a fingerprint recognition assembly 2. The display assembly 1 includes an array substrate 10 and a plurality of pixel units 11 disposed on the array substrate 10. The fingerprint recognition assembly 2 is disposed on one side of the array substrate 10 facing away from the plurality of pixel units 11, the fingerprint recognition assembly 2 includes a first substrate 20 and at least one fingerprint recognition unit 21 disposed on the first substrate 20, and the fingerprint recognition unit 21 is configured to perform a fingerprint recognition based on light reflected to the fingerprint recognition unit 21 via a touch object 4. The array substrate 10 includes a plurality of transparent regions A and a plurality of non-transparent regions B. The array substrate 10 further includes a plurality of metal wires 3, a ratio of a line width of a portion of at least one of the plurality of metal wires 3 disposed in at least one respective transparent region A to a line width of a portion of the at least one of the plurality of metal wires 3 disposed in a respective non-transparent region B is less than 1.

The touch object 4 is commonly a finger, and a fingerprint is formed by a series of ridges 41 and valleys 42 on a skin surface of a fingertip. Since distances from the ridges 41 and the valleys 42 to the fingerprint recognition unit 21 are different, the strengths of light reflected from the ridges 41 and the valleys 42 are different, so that the magnitudes of current signals converted from the reflection light formed at the ridges 41 and the valleys 42 are different, and thus the fingerprint recognition may be performed based on the magnitudes of the current signals. It should be noted that, the touch object 4 may be a palm and so on, and a palm print may also be utilized to achieve functions of detection and recognition.

Figure 3:
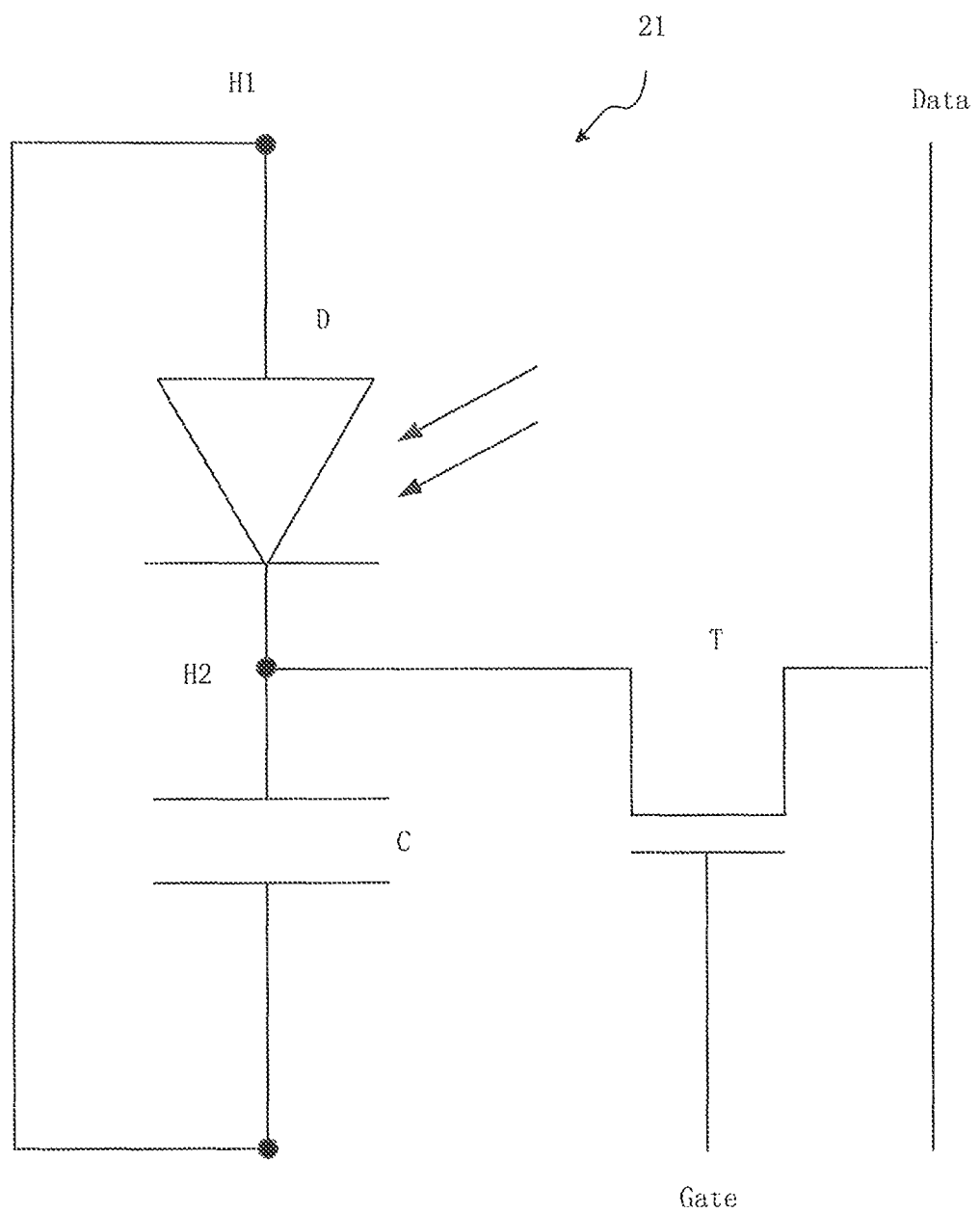
FIG. 3 is a structural diagram showing a circuit of a fingerprint recognition unit according to an embodiment of the present disclosure.
Figure 4:
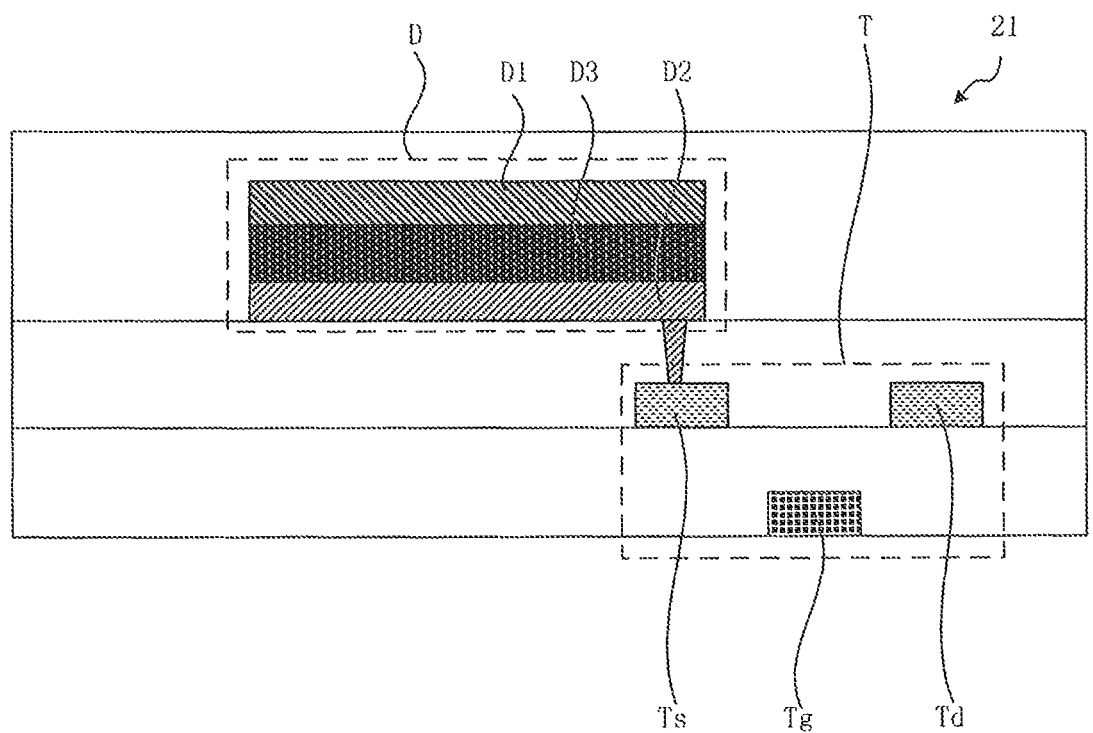
FIG. 4 is a structural diagram showing film layers of a fingerprint recognition unit according to an embodiment of the present disclosure.

FIG. 3 is a structural diagram showing a circuit of a fingerprint recognition unit according to an embodiment of the present disclosure, and FIG. 4 is a structural diagram showing film layers of a fingerprint recognition unit according to an embodiment of the present disclosure. In combination of FIG. 3 and FIG. 4, the fingerprint recognition unit 21 includes a photodiode D, a storage capacitor C and a thin-film transistor T. An anode D1 of the photodiode D is electrically connected to a first electrode of the storage capacitor C, and a cathode D2 of the photodiode D is electrically connected to a second electrode of the storage capacitor C and a source electrode Ts of the thin-film transistor T. A gate electrode Tg of the thin-film transistor T is electrically connected to a switching control line Gate, and the a drain electrode Td is electrically connected to a data signal line Data. The photodiode D is configured to convert the light reflected by the touch object into a current signal. In one embodiment, the photodiode D further includes a PIN junction D3 between the anode D1 and the cathode D2. Among them, the cathode D2 is formed by a non-transparent metal, and a boundary of the PIN junction D3 does not exceed a boundary of the cathode D2. The anode D1 of the photodiode D is disposed on one side of the PIN junction D3 facing away from the thin-film transistor T. The PIN junction D3 has a photosensitive feature and a feature of unilateral conduction. When there is no light to irradiate the photodiode D, the PIN junction D3 has an extremely small saturated reverse leakage current, that is, a dark current. At this moment, the photodiode D is cut off. When the photodiode D is irradiated by the light, the saturated reverse leakage current of the PN junction D3 is greatly increased to form a photocurrent, and the photocurrent varies with the strength of incident light.

A detailed description for principles of the fingerprint recognition performed by the display panel is given in combination with FIG. 3 and FIG. 4. In a fingerprint recognition stage, a low-voltage signal (e.g. a constant voltage signal with a magnitude of −5V) is inputted to a node H1, a high-voltage signal (e.g. a constant voltage signal with a magnitude of 1.5V) is inputted to the data line Data. The whole fingerprint recognition stage includes a preparation stage, a fingerprint signal collecting stage and a fingerprint detection stage. In the preparation stage, a driver chip (not shown in FIG. 3 and FIG. 4) electrically connected to the fingerprint recognition unit 21 controls the thin-film transistor T of the fingerprint recognition unit 21 to be turned on via the switching control line Gate. Then, the storage capacitor C is charged until a charging of the storage capacitor C is finished. In the fingerprint recognition stage, the thin-film transistor T of the fingerprint recognition unit 21 is controlled to be turned off via the switching control line Gate. When a user presses the display panel by using a finger, reflection light reflected by the finger enters into the fingerprint recognition unit 21 and is received by the photodiode D of the fingerprint recognition unit 21 to form a photocurrent. The direction of the photocurrent is directed from the node H2 to the node H1, so that the potential of the node H2 changes. In a fingerprint signal detection stage, a potential variation of the node H2 may be directly measured so as to determine the magnitude of the photocurrent, so that a function of fingerprint recognition of the display panel is achieved. Exemplarily, in the fingerprint signal detection stage, the switching control line Gate may be utilized to control the thin-film transistor T of the fingerprint recognition unit 21 to be turned on. At this moment, potential difference between two electrodes of the storage capacitor C occurs, and the storage capacitor C is in a charging state. By measuring the charged charge amount of the storage capacitor C, the magnitude of the photocurrent is determined and the function of fingerprint recognition of the display panel is achieved.

In one embodiment, as shown in FIG. 1, the non-transparent regions B may be arranged in a matrix along a first extending direction XX and a second extending direction YY, and the first extending direction XX and the second extending direction YY are perpendicular to each other. The metal wires 3 include first metal wires 31 and second metal wires 32, and the first metal wires 31 are disposed along the first extending direction XX and the second metal wires 32 are disposed along the second extending direction YY. A ratio of a line width of a portion of at least one of the first metal wires 31 disposed in at least one respective transparent region A to a line width of a portion the at least one of the first metal wires 31 disposed in a respective non-transparent region B is configured to be less than 1, and a ratio of a line width of a portion of at least one of the second metal wires 32 disposed in at least one respective transparent region A to a line width of a portion the at least one of the second metal wires 32 disposed in a respective non-transparent region B is configured to be less than 1. FIG. 1 shows a partial area of the display panel, and a ratio of a line width of a portion of a first metal wire 31 disposed in a respective transparent region A to a line width of a portion the first metal wire 31 disposed in a respective non-transparent region B is configured to be less than 1 in the partial area. That is, in the partial area, the line width of a portion of the first metal wire 31 disposed in the respective transparent region A is smaller than that of a portion of the first metal wire 31 disposed in the respective non-transparent region B. Similarly, a ratio of a line width of a portion of a second metal wire 32 disposed in a respective transparent region A to a line width of a portion the second metal wire 32 disposed in a respective non-transparent region B in the partial area is configured to be less than 1. That is, in the partial area, the line width of a portion of the second metal wire 32 disposed in the respective transparent region A is smaller than that of a portion of the second metal wire 32 disposed in the respective non-transparent region B. In contrast with a related art, the line widths of portions of the first metal wire 31 and the second metal wire 32 disposed in the respective transparent region A are reduced, obscurations of portions of the first metal wire 31 and the second metal wire 32 disposed in the respective transparent region A to the light reflected to the fingerprint recognition assembly 2 are decreased, thereby improving the strength of fingerprint recognition signals of the display panel.

Figure 5:
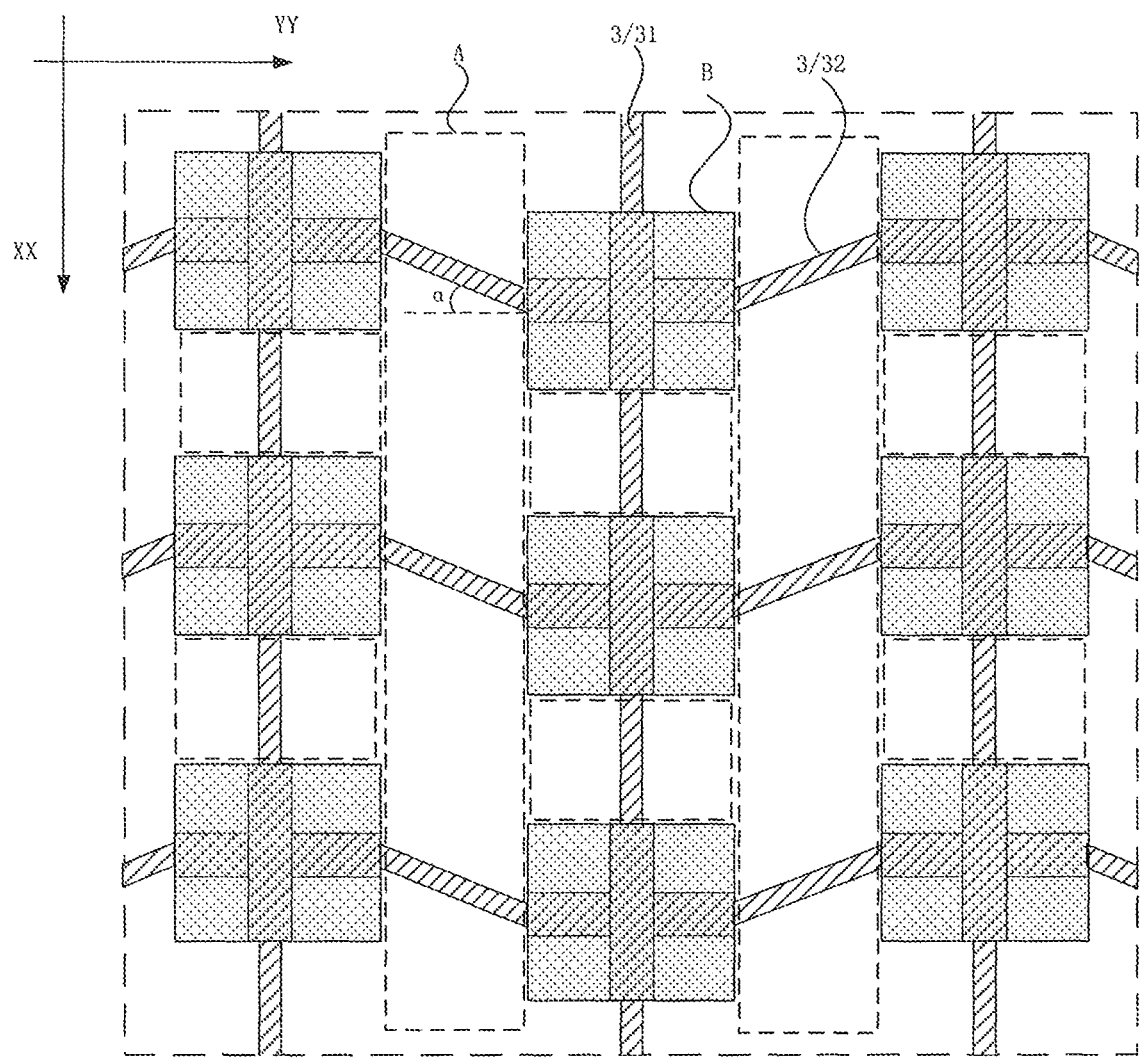
FIG. 5 is a top view of another display panel according to an embodiment of the present disclosure.

FIG. 5 is a top view of another display panel according to an embodiment of the present disclosure. As shown in FIG. 5, the non-transparent regions B of the array substrate 10 are arranged in multiple columns along the first extending direction XX, the non-transparent regions B in adjacent two columns are disposed along the second extending direction YY in a non-aligned manner, and the first extending direction XX and the second extending direction YY are perpendicular to each other. The metal wires 3 include first metal wires 31 and second metal wires 32. The first metal wires 31 are disposed along the first extending direction XX, and along the second extending direction YY, a portion of each second metal wire 32 mapped to the non-transparent regions B in a respective column is located in the non-transparent regions B in the respective column. A ratio of a line width of a portion of at least one of the first metal wires 31 disposed in at least one respective transparent region A to a line width of a portion of the at least one of the first metal wires 31 disposed in a respective non-transparent region B is configured to be less than 1, and a ratio of a line width of a portion of at least one of the second metal wires 32 disposed in at least one respective transparent region A to a line width of a portion of the at least one of the second metal wires 32 disposed in a respective non-transparent region B is configured to be less than 1. FIG. 5 exemplarily shows a partial area of the display panel, the line width of a portion of a first metal wire 31 disposed in a respective transparent region A is smaller than that of a portion of the first metal wire 31 disposed in a respective non-transparent region B, and the line width of a portion of a second metal wire 31 disposed in a respective transparent region A is smaller than that of a portion of the second metal wire 31 disposed in a respective non-transparent region B. In contrast with a related art, the line width of a portion of the first metal wire 31 and the second metal wire 32 disposed in the respective transparent region A is reduced, and the strength of fingerprint recognition signals of the display panel is improved.

In addition, since the non-transparent regions B in adjacent columns are disposed along the second extending direction YY in a non-aligned manner, by providing a portion of the second metal wire 32 mapped to the non-transparent regions B in a respective column is located in the non-transparent regions B, a bend occurs in the second metal wire 32 along the second extending direction YY. FIG. 5 exemplarily shows a configuration that the second metal wire 32 is arranged as a non-right-angled broken line along the second extending direction YY. In one embodiment, an acute angle α formed between the second extending direction YY and a portion of the second metal wire 32 arranged not along the second extending direction YY is larger than or equal to 10 degrees and less than or equal to 80 degrees. In one embodiment, the second metal wire 32 may be configured to be arranged as a right-angled broken line along the second extending direction YY.

Figure 7:
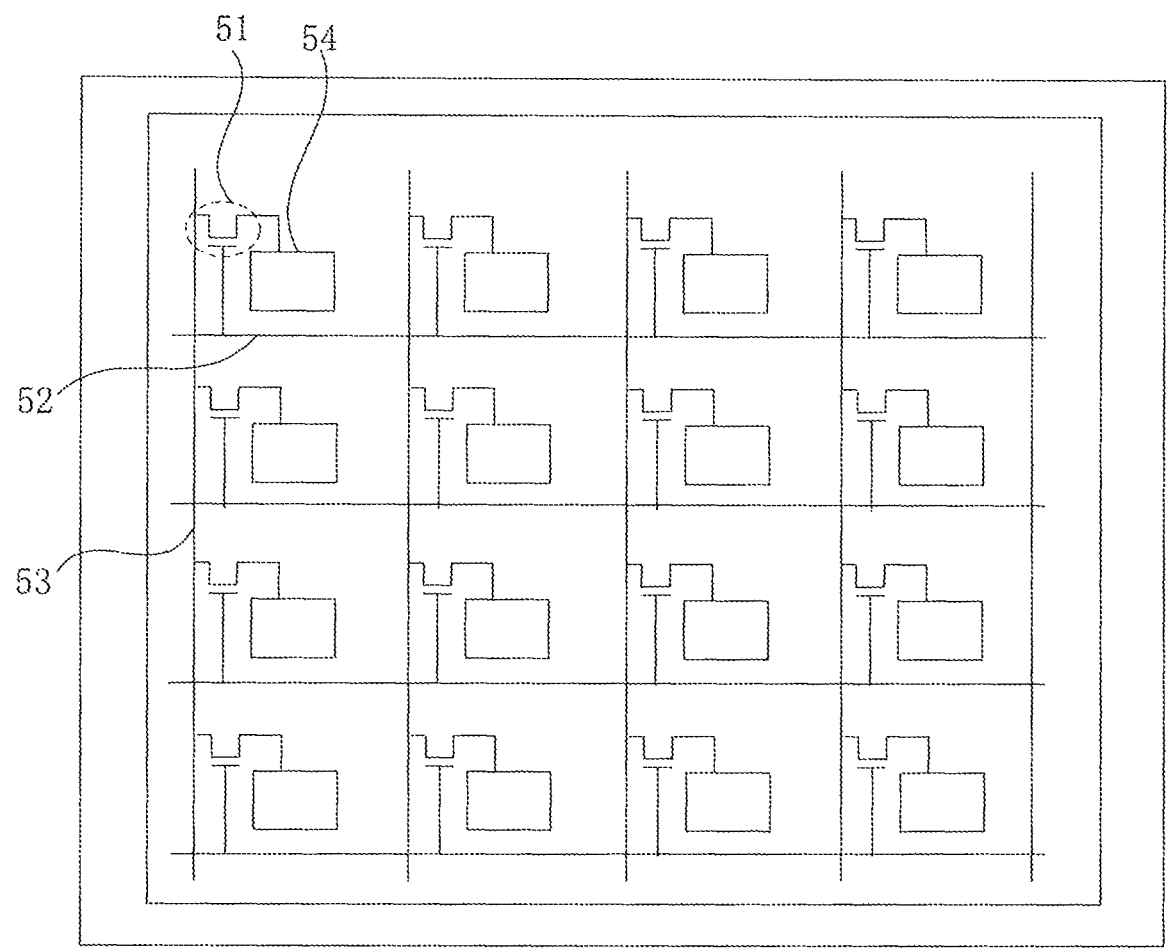
FIG. 7 is a top view of another display panel according to an embodiment of the present disclosure.

FIG. 7 is a top view of another display panel according to an embodiment of the present disclosure. As shown in FIG. 7, a display panel is, for example, an organic light-emitting display panel. The display panel includes a plurality of pixel circuits 51, a plurality of scanning signal lines 52, a plurality of data signal lines 53 and a plurality of organic light-emitting elements 54. A pixel circuit 51 and an organic light emitting element 54 may be disposed in a space formed by the intersection of the scanning signal lines 52 and the data signal lines 53. A pixel circuit 51 may communicate with the data signal line 52 and organic light-emitting element 54 electrically connected to the pixel circuit 51 under the action of a scanning signal inputted by the scanning signal line 52 electrically connected to the pixel circuit 51. A data line 53 transmits a data signal to the respective organic light-emitting element 54, and thus a display function of the display panel is achieved base on above.

Figure 6:
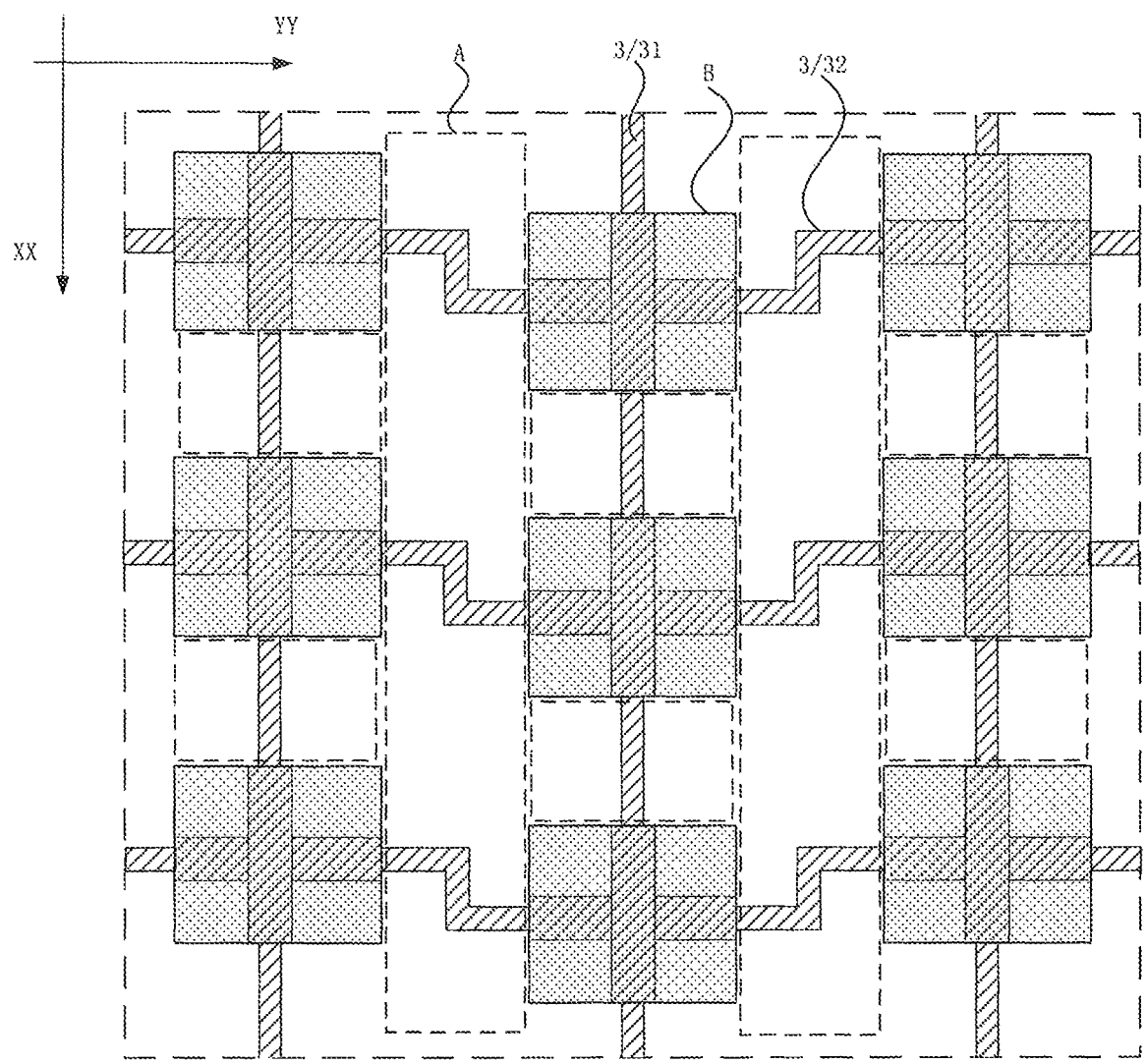
FIG. 6 is a top view of another display panel according to an embodiment of the present disclosure.
Figure 8:
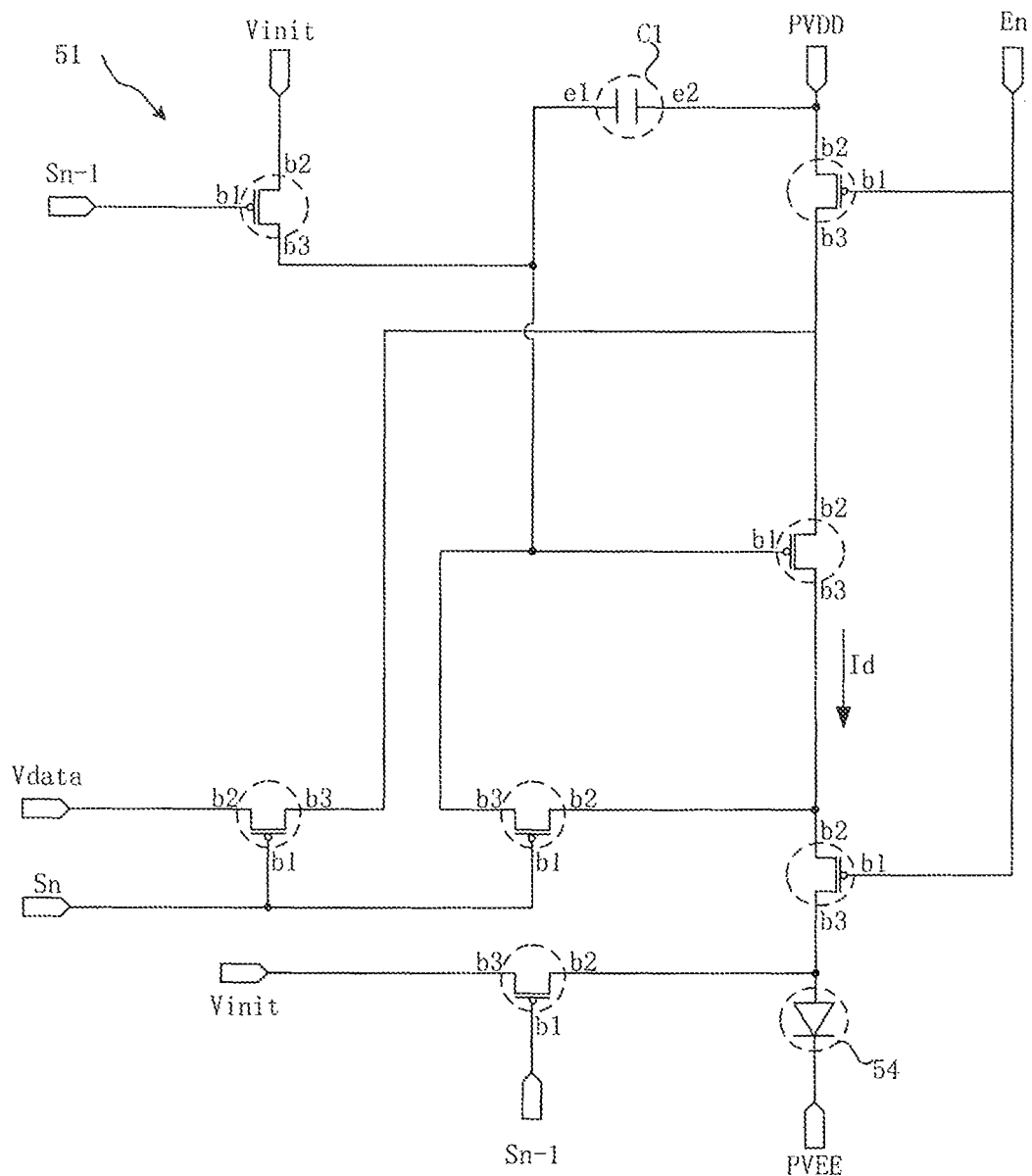
FIG. 8 is a diagram showing a circuit structure of a pixel circuit according to an embodiment of the present disclosure.

FIG. 8 is a diagram showing a circuit structure of a pixel circuit according to an embodiment of the present disclosure. In combination with FIG. 7 and FIG. 8, a power signal line is electrically connected to a terminal PVDD, the data signal line 53 is electrically connected to a terminal Vdata of a pixel circuit 51 corresponding to the data signal line 53, the scanning signal line 52 is electrically connected to a terminal Sn of a pixel circuit 51 corresponding to the scanning signal line 52, and a terminal Sn−1 of the pixel circuit 51 is electrically connected to a scanning signal line 52 corresponding to a pixel circuit 51 in a previous row, the reset signal line is electrically connected to a terminal Vinit, and the capacitance signal line and the capacitor C1 may be fabricated in one layer so as to achieve connections of the capacitor. In combination with FIG. 5 and FIG. 6, the first metal wires 31 include a power signal line and a data signal line, and the second metal wire includes a scanning signal line, a reset signal line and a capacitance signal line.

Figure 9:
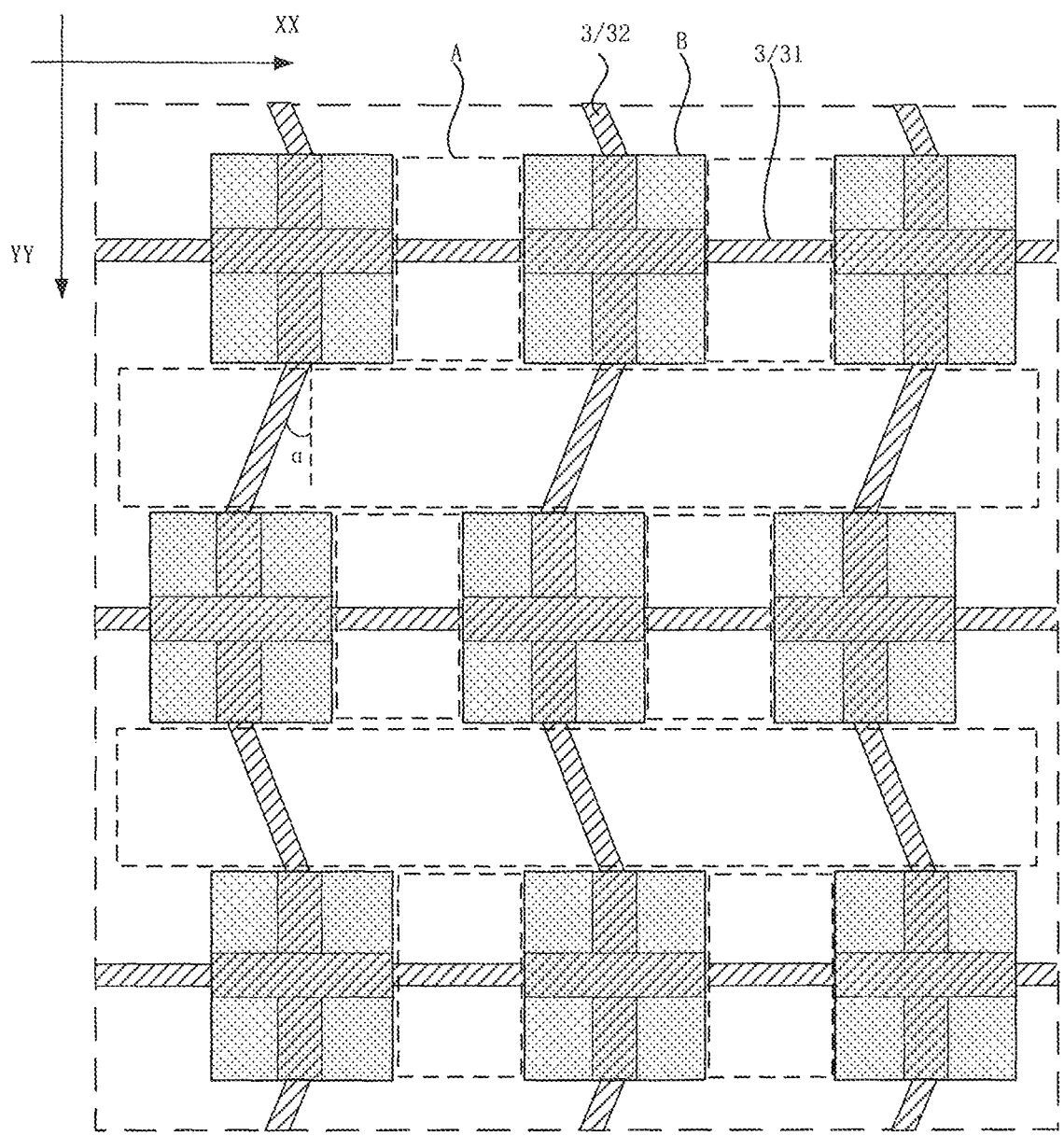
FIG. 9 is a top view of another display panel according to an embodiment of the present disclosure.

FIG. 9 is a top view of another display panel according to an embodiment of the present disclosure. As shown in FIG. 9, the non-transparent regions B of the array substrate 10 are arranged in multiple rows along the first extending direction XX, the non-transparent regions B in adjacent two rows are disposed along the second extending direction YY in a non-aligned manner, and the first extending direction XX and the second extending direction YY are perpendicular to each other. The metal wires 3 include first metal wires 31 and second metal wires 32, the first metal wires 31 are disposed along the first extending direction XX, and along the second extending direction YY, a portion of the second metal wire 32 mapped to non-transparent regions B in respective column is located in the non-transparent regions B. A ratio of a line width of a portion of at least one of the first metal wires 31 disposed in at least one respective transparent region A to a line width of a portion of the at least one first metal wire 31 disposed in a respective non-transparent region B is configured to be less than 1, and a ratio of a line width of a portion of at least one of the second metal wires 32 disposed in at least one respective transparent region A to a line width of a portion of the at least one of the second metal wire 32 disposed in a respective non-transparent region B is configured to be less than 1. FIG. 9 exemplarily shows a partial area of the display panel, in the partial area, the line width of a portion of a first metal wire 31 disposed in a respective transparent region A is smaller than that of a portion of the first metal wire 31 disposed in a respective non-transparent region B, and the line width of a portion of the second metal wire 31 disposed in a respective transparent region A is smaller than that of a portion of the second metal wire 31 disposed in a respective non-transparent region B. In contrast with a related art, the line width of portions of the first metal wires 31 and the second metal wires 32 disposed in the respective transparent region A is reduced, the strength of fingerprint recognition signals of the display panel is improved.

Figure 10:
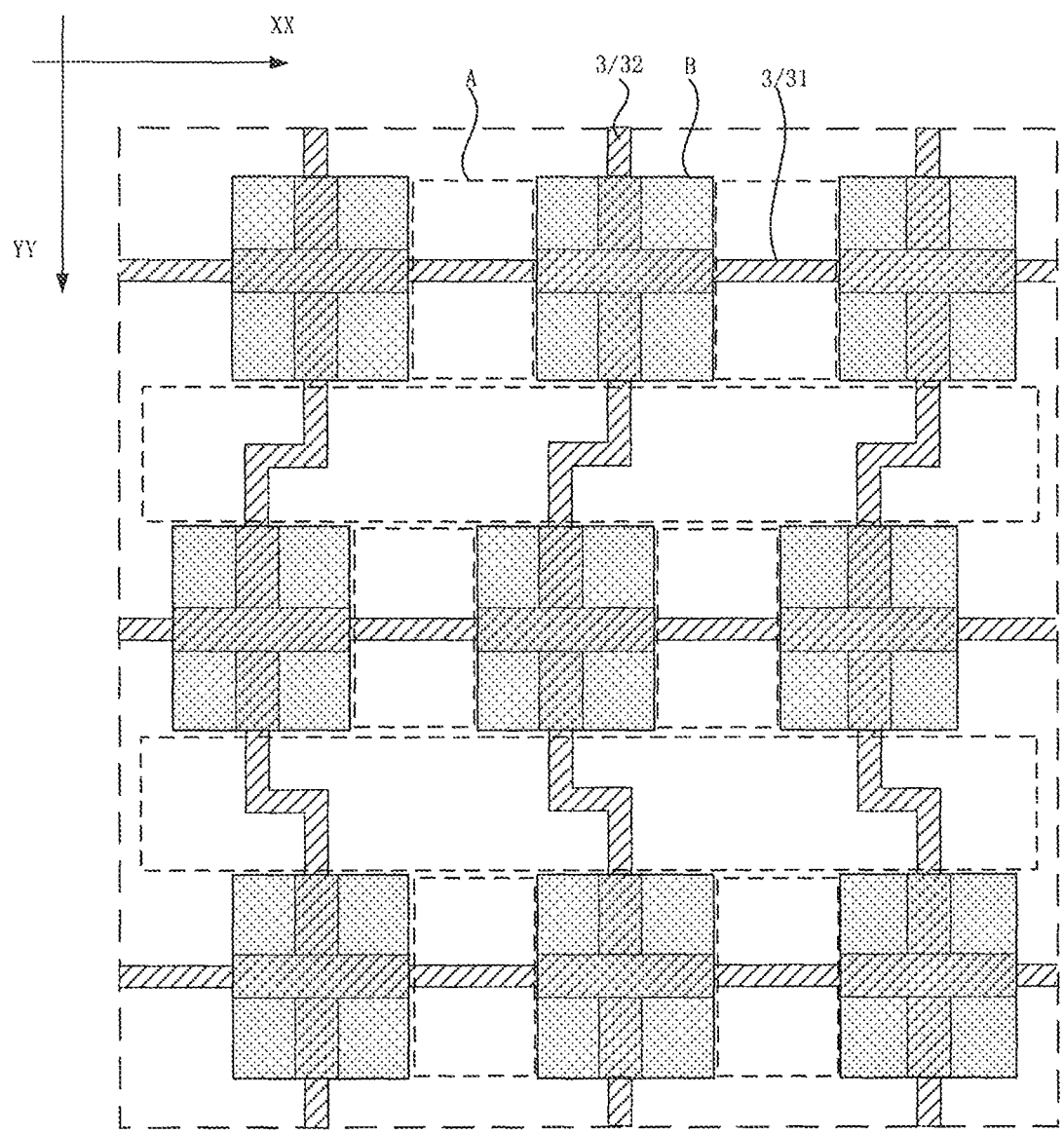
FIG. 10 is a top view of another display panel according to an embodiment of the present disclosure.

In addition, since the non-transparent regions B in adjacent two rows are disposed along the second extending direction YY in a non-aligned manner, by providing a portion of the second metal wire 32 mapped to non-transparent regions B in a respective row is located in the non-transparent regions B, a bend occurs in the second metal wire 32 along the second extending direction YY. FIG. 9 exemplarily shows a configuration that the second metal wire 32 is arranged as a non-right-angled broken line along the second extending direction YY. In one embodiment, an acute angle α formed between the second extending direction YY and a portion of the second metal wire 32 arranged not along the second extending direction YY is larger than or equal to 10 degrees and less than or equal to 80 degrees. In one embodiment, as shown in FIG. 10, the second metal Wire 32 may also be configured to be arranged as a right-angled broken line along the second extending direction YY. In combination with FIG. 9 and FIG. 10, the first metal wires 31 includes a scanning signal line, a reset signal line and a capacitance signal line, and the second metal wires 32 includes a power signal line and a data signal line.

Figure 11:
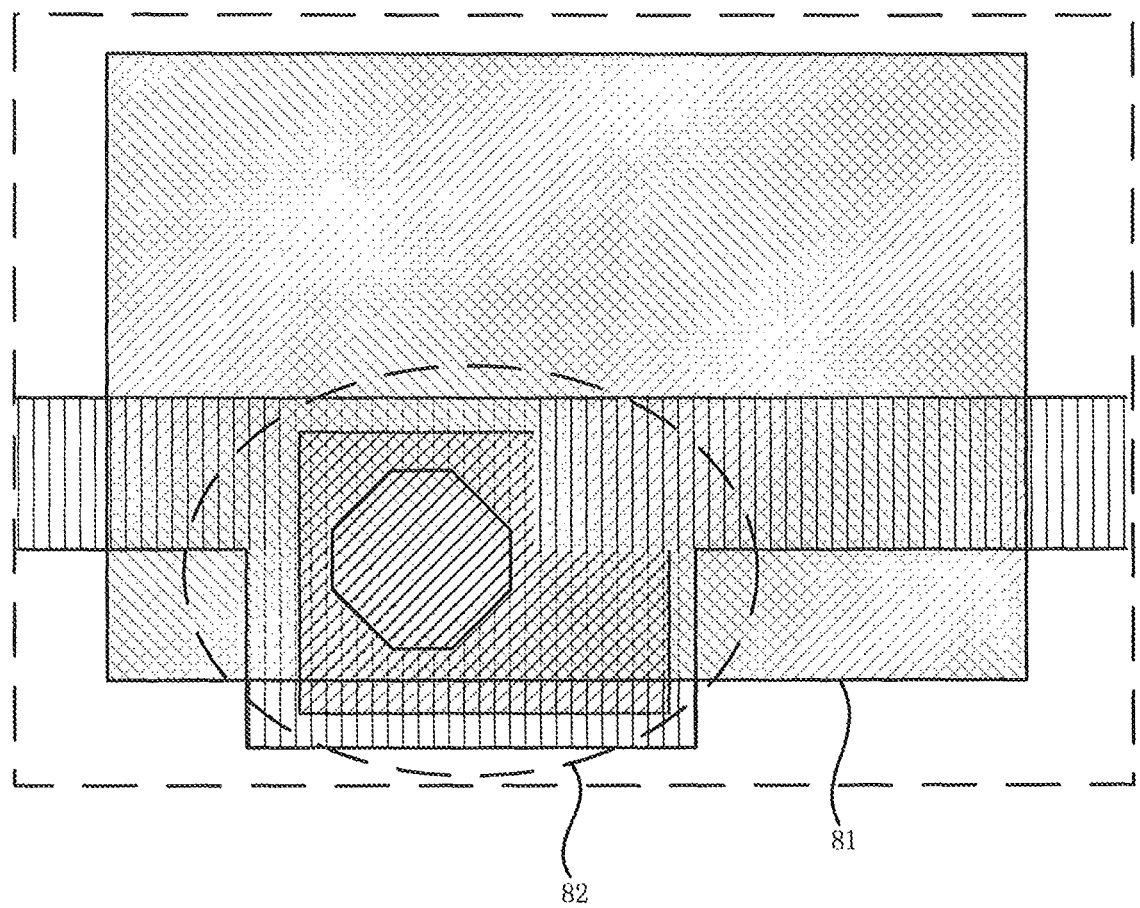
FIG. 11 is a diagram showing a layout of an array substrate according to an embodiment of the present disclosure.

FIG. 11 is a diagram showing a layout of an array substrate according to an embodiment of the present disclosure. As shown in FIG. 11, the array substrate may include a plurality of reflective electrodes 81 and a plurality of capacitors 82. Only one reflective electrode 81 and one capacitor 82 in a local area of the array substrate are exemplarily shown here, and non-transparent regions of the array substrate are areas in which the reflective electrodes 81 and the plurality of capacitors disposed. Exemplarily, the display panel may be an organic light-emitting display panel, and the reflective electrode is one of non-transparent electrodes in the anode or the cathode. The display panel may also be a liquid crystal display panel, in this case the array substrate does not include a capacitor, and the reflective electrode is one of non-transparent electrodes in pixel electrodes or common electrodes.

In one embodiment, as shown in FIG. 2, the pixel unit 11 provides a light source for the fingerprint recognition assembly 2, the fingerprint recognition unit 21 is configured to perform a fingerprint recognition according to the light emitted from the pixel unit 11 reflecting to the fingerprint recognition unit 21 via the touch object 4. The display panel may be an organic light-emitting display panel, the pixel unit 11 may be an organic light-emitting structure, the fingerprint recognition unit 21 is configured to perform a fingerprint recognition according to the light emitted from the organic light-emitting structure reflecting to the fingerprint recognition unit 21 via the touch object 4, for example, the light represented by a solid line as shown in FIG. 2. It should be noted that, FIG. 2 merely exemplarily configures relative positions of the organic light-emitting structure and the fingerprint recognition unit 21, the relative positions of the organic light-emitting structure and the fingerprint recognition unit 21 are not limited in the present disclosure, as long as the light emitted from the organic light-emitting structure is guaranteed to be reflected to the fingerprint recognition unit 21 via the touch object 4.

In one embodiment, as shown in FIG. 2, the fingerprint recognition assembly 2 further includes a fingerprint recognition light source 22, and the fingerprint recognition light source 22 is disposed on one side of the first substrate 20 facing away from fingerprint recognition unit 21, and the fingerprint recognition unit 21 is configured to perform a fingerprint recognition based on the light emitted from the fingerprint recognition light source 22 reflecting to the fingerprint recognition unit 21 via the touch object 4, for example, the light represented by a dotted line as shown in FIG. 2. In one embodiment, the light emitted from the fingerprint recognition light source 22 irradiates to the touch object 4 via a gap between adjacent two fingerprint recognition units 21

It should be noted that, positions of the fingerprint recognition light source 22 are not limited in the present disclosure, as long as the light emitted from the organic light-emitting structure is guaranteed to be reflected to the fingerprint recognition unit 21 via the touch object 4. Meanwhile, the light represented by the solid lines and dotted lines shown in FIG. 2 merely exemplarily give a certain light emitted from the organic light-emitting structure 11 and the fingerprint recognition light source 22, and the light emitted by the organic light emitting unit 11 and the fingerprint recognition light source may be divergent.

Exemplarily, the fingerprint recognition light source 22 may be a collimated light source or a surface light source. In contrast with an adoption of the surface light source, the adoption of the collimated light source may decrease the interferences of the light formed by reflection of the collimated light source via a fingerprint of the user between different fingerprint recognition assemblies 2, so that the accuracy of the fingerprint recognition is improved. Since the thickness of the collimated light source is always larger than that of the surface light source, the usage of the collimated light source may increase the thickness of the display panel.

In one embodiment, as shown in FIG. 2, the display panel further includes an encapsulation layer 12, a polarizer 13, a glass cover plate 14 sequentially disposed on the pixel unit 11. Among them, the encapsulation layer 12 may include an encapsulation glass or a thin-film encapsulation layer. When the encapsulation layer 12 includes the encapsulation glass, the display panel may not be bent; and when the encapsulation layer 12 includes the thin-film encapsulation layer, the display panel may be bent. In one embodiment, the first substrate 20 served as a base of the fingerprint recognition unit 21 may include a glass substrate or a flexible substrate. Exemplarily, the cover plate glass 14 is attached with the polarizer 13 by using optical cement.

It should be noted that, the attached drawings in the present disclosure only exemplarily shows the size of each element instead of practical size of each element in the display panel.

Figure 12:
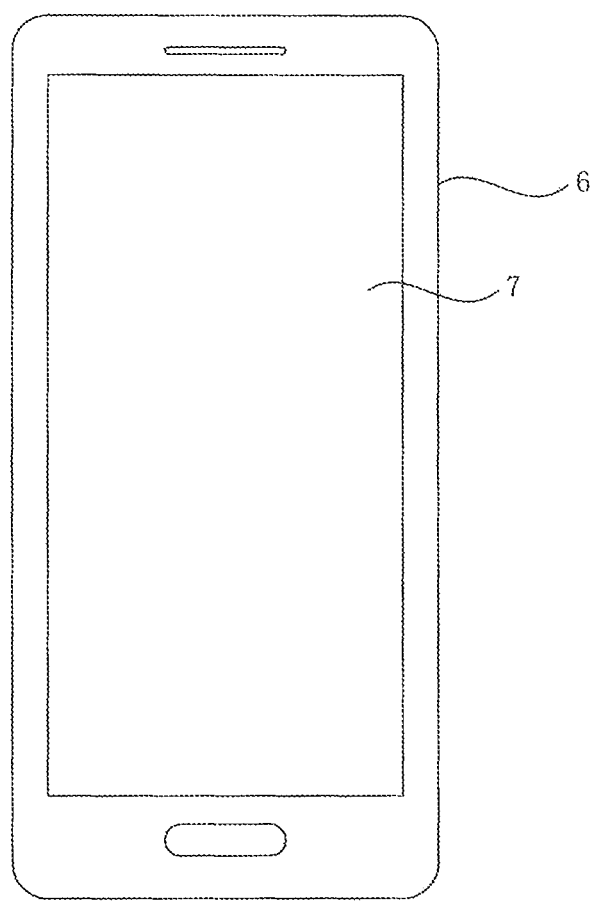
FIG. 12 is a structural diagram showing a display device according to an embodiment of the present disclosures.

The present disclosure further provides an organic light-emitting display device, and FIG. 12 is a structural diagram showing an organic light-emitting display device according to an embodiment of the present disclosure. As shown in FIG. 12, the organic light-emitting display device 6 includes the organic light-emitting display panel in above embodiments. Therefore, the organic light-emitting display device 6 provided by the present disclosure also have the beneficial effects of above embodiments, and no repetitions are made here.

It should be noted that the above contents are only preferred embodiments of the present disclosure and its technical principles. It can be understood for those skilled in the art that the present disclosure is not limited to specific embodiments described herein. For those skilled in the art, the present disclosure can be subject to various apparent variations, readjustments and replacements without departing from a protection scope of the present disclosure. Therefore, although the present disclosure is described in detail through above embodiments, the present disclosure is not only limited to above embodiments. The present disclosure can also include more other equivalent embodiments without deviating from conceptions of the present disclosure. A scope of the present disclosure is determined by a scope of attached claims.

What is claimed is:

1. A display panel, comprising:
   a display assembly, wherein the display assembly comprises an array substrate and a plurality of pixel units disposed on the array substrate;
   a fingerprint recognition assembly, wherein the fingerprint recognition assembly disposed on one side of the array substrate facing away from the plurality of pixel units, wherein the fingerprint recognition assembly comprises a first substrate and at least one fingerprint recognition unit disposed on the first substrate, and wherein the at least one fingerprint recognition unit is configured to perform a fingerprint recognition based on light reflected to the fingerprint recognition unit via a touch object; and wherein the array substrate comprises a plurality of transparent regions and a plurality of non-transparent regions, wherein the array substrate further comprises a plurality of metal wires, for at least one of the plurality of metal wires, a ratio of a line width of a portion of at least one of the plurality of metal wires disposed in at least one respective non-transparent region to a line width of a portion of the at least one of the plurality of metal wires disposed in a respective transparent region is less than 1;

wherein the plurality of metal wires comprise a plurality of first metal wires and a plurality of second metal wires, wherein the plurality of first metal wires comprises a scanning signal line, a reset signal line and a capacitance signal line, and the plurality second metal wires comprises a power signal line and a data signal line;

wherein the display panel further comprises a plurality of reflective electrodes and a plurality of capacitors, and the plurality of non-transparent regions of the array substrate are areas in which the plurality of reflective electrodes and the plurality of capacitors are disposed.

2. The display panel according to claim 1, wherein
the plurality of non-transparent regions arranged in a matrix along a first extending direction and a second extending direction, wherein the first extending direction and the second extending direction are perpendicular to each other; and
wherein the plurality of first metal wires are disposed along the first extending direction and the plurality of second metal wires are disposed along the second extending direction.

3. The display panel according to claim 1, wherein
the plurality of non-transparent regions are arranged in multiple columns along a first extending direction, non-transparent regions in adjacent columns are disposed along a second extending direction in a non-aligned manner, and wherein the first extending direction and the second extending direction are perpendicular to each other; and
wherein the plurality of first metal wires are disposed along the first extending direction, along the second extending direction, a portion of each second metal wire mapped to non-transparent regions in a respective column is located in the non-transparent regions in the respective column.

4. The display panel according to claim 3, wherein the plurality second metal wires each are arranged as a right-angled broken line along the second extending direction.

5. The display panel according to claim 3, wherein the plurality second metal wires each are arranged as a non-right-angled broken line along the second extending direction.

6. The display panel according to claim 5, wherein an acute angle formed between the second extending direction and a portion of each second metal wire arranged not along the second extending direction is larger than or equal to 10 degrees and less than or equal to 80 degrees.

7. The display panel according to claim 1, wherein
the plurality of non-transparent regions are arranged in multiple rows along a first extending direction, non-transparent regions in adjacent two rows are disposed along a second extending direction in a non-aligned manner, and wherein the first extending direction and the second extending direction are perpendicular to each other; and
wherein the plurality of first metal wires are disposed along the first extending direction, along the second extending direction, a portion of each second metal wire mapped to non-transparent regions in a respective row is located in the non-transparent regions in the respective row.

8. The display panel according to claim 7, wherein the plurality second metal wires each are arranged as a right-angled broken line along the second extending direction.

9. The display panel according to claim 7, wherein the plurality second metal wires each are arranged as a non-right-angled broken line along the second extending direction.

10. The display panel according to claim 9, wherein an acute angle formed between the second extending direction and a portion of each second metal wire arranged not along the second extending direction is larger than or equal to 10 degrees and less than or equal to 80 degrees.

11. The display panel according to claim 1, wherein the plurality of pixel units each provide a light source for the fingerprint recognition assembly, the at least one fingerprint recognition unit is configured to perform a fingerprint recognition based on light emitted from the plurality of pixel units reflecting to the at least one fingerprint recognition unit via the touch object.

12. The display panel according to claim 1, wherein
the fingerprint recognition assembly further comprises a fingerprint recognition light source, wherein the fingerprint recognition light source is disposed on one side of the first substrate facing away from the at least one fingerprint recognition unit;
wherein light emitted from the fingerprint recognition light source irradiates the touch object via a gap between adjacent two of the at least one fingerprint recognition unit, and the at least one fingerprint recognition unit is configured to perform a fingerprint recognition based on the light emitted from the fingerprint recognition light source reflecting to the fingerprint recognition unit via the touch object.

13. The display panel according to claim 12, wherein the fingerprint recognition light source is a collimated light source or an area light source.

14. The display panel according to claim 1, wherein the display panel further comprises:
an encapsulation layer, a polarizer, a glass cover plate and a touch electrode layer sequentially disposed on the plurality of pixel units;
wherein the encapsulation layer comprises an encapsulation glass or a thin-film, encapsulation layer;
wherein the glass cover plate is attached to the polarizer by using optical cement;
wherein the touch electrode layer is disposed between the encapsulation layer and the polarizer, or between the glass cover plate and the polarizer; and
wherein the first substrate is a glass substrate or a flexible substrate.

15. A display device, comprising a display panel, wherein the display panel comprises:
a display assembly, wherein the display assembly comprises an array substrate and a plurality of pixel units disposed on the array substrate;

a fingerprint recognition assembly, wherein the fingerprint recognition assembly disposed on one side of the array substrate facing assay from the plurality of pixel units, wherein the fingerprint recognition assembly comprises a first substrate and at least one fingerprint recognition unit disposed on the first substrate, and wherein the at least one fingerprint recognition unit is configured to perform a fingerprint recognition based on light reflected to the fingerprint recognition unit via a touch object;

wherein the array substrate comprises a plurality of transparent regions and a plurality of non-transparent regions, wherein the array substrate further comprises a plurality of metal wires, for at least one of the plurality of metal wires, a ratio of a line width of a portion of at least one of the plurality of metal wires disposed in at least one respective non-transparent region to a line width of a portion of the at least one of the plurality of metal wires disposed in a respective transparent region is less than 1; and wherein the plurality of metal wires comprise a plurality of first metal wires and a plurality of second metal wires, wherein the plurality of first metal wires comprises a scanning signal line, a reset signal line and a capacitance signal line, and the plurality second metal wires comprises a power signal line and a data signal line;

wherein the display panel further comprises a plurality of reflective electrodes and a plurality of capacitors, and the plurality of non-transparent regions of the array substrate are areas in which the plurality of reflective electrodes and the plurality of capacitors are disposed.

\* \* \* \* \*